United States Patent [19]

Park

[11] Patent Number: 5,786,734
[45] Date of Patent: Jul. 28, 1998

[54] TEMPERATURE COMPENSATED RING OSCILLATOR ON A SEMICONDUCTOR SUBSTRATE

[75] Inventor: Hyung-Sik Park, Seoul, Rep. of Korea

[73] Assignee: Samsung Electronics Co., Ltd., Suwon, Rep. of Korea

[21] Appl. No.: 748,334

[22] Filed: Nov. 13, 1996

[30] Foreign Application Priority Data

Nov. 13, 1995 [KR] Rep. of Korea ............... 1995/40990

[51] Int. Cl.⁶ ............................ H03B 5/04; H03L 1/02
[52] U.S. Cl. ............................ 331/57; 331/176
[58] Field of Search ......................... 331/57, 176

[56] References Cited

U.S. PATENT DOCUMENTS

| 4,223,524 | 9/1980 | Nakagawa ................... 331/176 |
| 5,180,995 | 1/1993 | Hayashi et al. ................ 331/57 |
| 5,331,296 | 7/1994 | Davis ........................ 331/158 |

Primary Examiner—Siegfried H. Grimm
Attorney, Agent, or Firm—Jones & Volentine, L.L.P.

[57] ABSTRACT

A temperature compensated oscillator circuit includes the parallel combination of an inverter, feedback resistance and temperature compensating means connected between an input terminal and an output terminal.

5 Claims, 2 Drawing Sheets

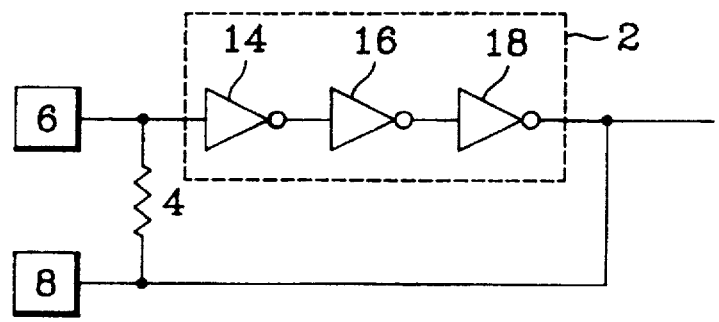
(PRIOR ART)
*Fig_1*
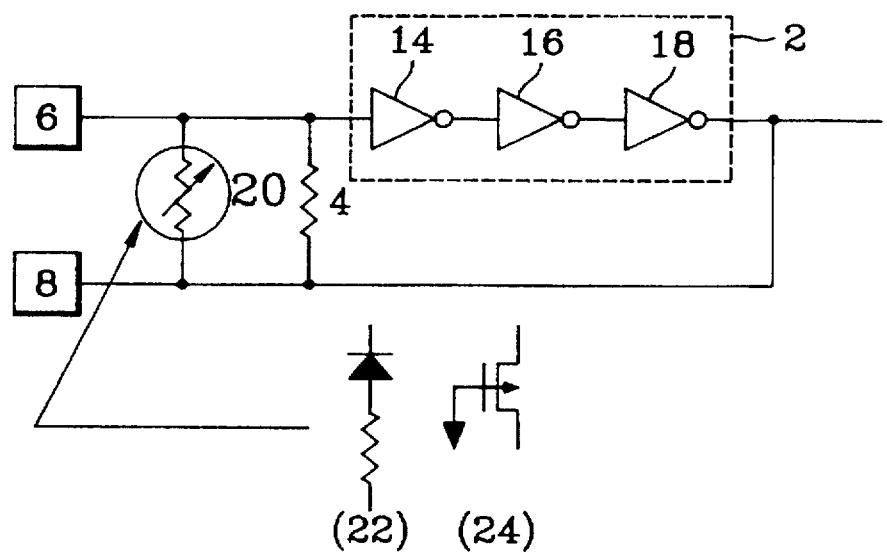
*Fig_2*

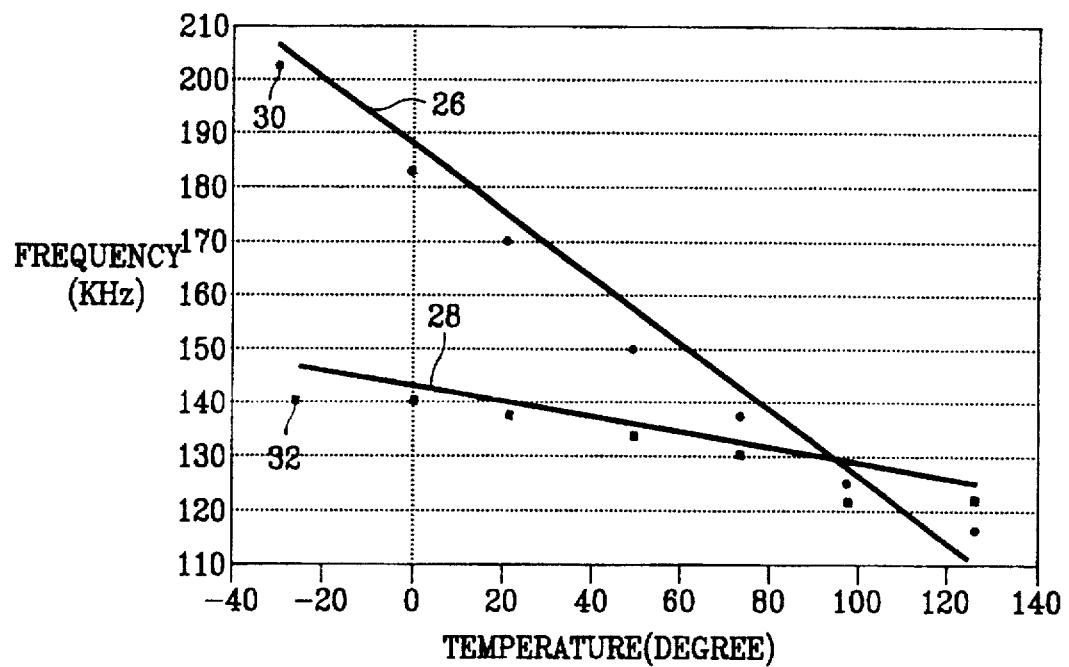
Fig_3

TEMPERATURE COMPENSATED RING OSCILLATOR ON A SEMICONDUCTOR SUBSTRATE

BACKGROUND OF THE INVENTION

The present invention relates to an oscillator formed on a semiconductor substrate. More particularly, the present invention relates to a temperature compensated oscillator circuit for use in a semiconductor device.

Oscillator circuits are well known as sources of reference clock signals, and are employed in a variety of electrical circuits. Crystal controlled oscillator circuits are commonly used to generate clock signals because of their very stable output and their reliability. Unfortunately, crystal controlled oscillators have customarily been implemented on a printed circuit boards since their size prevents formation on a semiconductor substrate. The "external" implementation of such oscillator circuits not only results in the use of excessive space within the overall device, but also creates undue time delays between the clock signal generating circuit and other circuits resident on the semiconductor substrate. Crystal controlled oscillators are also unacceptably expensive for a growing number of commercial applications.

Thus, it has become increasingly desirable to provide an oscillator circuit on the semiconductor substrate which is inexpensive and easy to implement, but which also provides a frequency stable output. Unfortunately, "on-chip" oscillators are generally unstable, and are particularly unstable under the influence of changing ambient temperatures.

FIG. 1 illustrates a conventional oscillator circuit. In FIG. 1, the oscillator circuit includes a feedback resistance 4 connected between an input terminal 6 and an output terminal 8. The oscillator circuit also includes an inverting means 2, formed by series connected inverters 14, 16 and 18, connected between input terminal 6 and output terminal 8.

Within this circuit, the resistance of feedback resistance 4 and inverting means 2 vary with temperature. Thus, the frequency of the oscillator circuit output also varies with temperature. More specifically, as the ambient temperature rises, the resistance of inverting means 2 and feedback resistance 4 also rises. The increased resistance causes an undesired decrease in the frequency of the oscillator circuit output. Temperature induced changes in the channel characteristics of the N and P type transistors forming the elements in the oscillator circuit also effect the frequency of the output signal.

SUMMARY OF THE INVENTION

The present invention provides a temperature compensated oscillator circuit for use in a semiconductor device. The temperature compensation of the present invention provides a very stable output signal.

To accomplish this, the present invention provides a temperature compensated oscillator circuit formed on a semiconductor substrate of a semiconductor device which includes; an inverter connected between an input terminal and an output terminal, feedback resistance connected in parallel with the inverter, and temperature compensating means connected in parallel with the feedback resistance.

In one aspect of the present invention, the temperature compensating means is a diode and resistor combination. In another aspect of the present invention, the temperature compensating means is a transistor having a grounded gate.

BRIEF DESCRIPTION OF THE DRAWINGS

A more complete appreciation of the present invention and its attendant advantages may be had upon consideration of the following explanation of a presently preferred embodiment in conjunction with the accompanying drawings in which:

FIG. 1 is a diagrammatic view showing a conventional oscillator circuit;

FIG. 2 is a diagrammatic view showing an oscillator circuit according to an embodiment of the present invention; and FIG. 3 is a graph illustrating frequencies performance of the circuit shown in FIG. 2.

DETAILED DESCRIPTION OF THE PREFERRED EMBODIMENTS

Throughout the drawings, like reference numerals are used to indicate like elements. FIG. 2 illustrates an oscillator circuit according to an embodiment of the present invention.

Referring to FIG. 2, the oscillator circuit according to the present invention comprises; a feedback resistance 4 connected between an input terminal 6 and an output terminal 8, inverting means 2, formed from series connected inverters 14, 16, and 18, connected in parallel with feedback resistance 4, and temperature compensating means 20 connected parallel with the feedback resistance means 4.

The temperature compensating means 20 may be formed by any circuit adapted to inhibit a change in resistance resulting from a change in temperature. For example, a diode and resistor combination 22, or a transistor 24 having a gate connected to ground may be used as temperature compensating means 20.

Within this circuit, if the resistance of inverting means 2 and feedback resistance 4 decrease with an increase in temperature, and the resistance of temperature compensating means 3, as is the normal reaction, decreases with temperature, a temperature compensation effect results which may be expressed by the following equation:

$$R2+R4 > R2+(R2+R4)/R4 \cdot R20 \ldots \text{(Formular)}$$
$$(\therefore R4 > (R4+R20)/R4 \cdot R20)$$

In this equation, the parallel combination of feedback resistance R4 and resistance R20 of the temperature compensating means is less than feedback resistance R4 although resistance of the temperature compensating means is large. Also, a mechanism in which the amount of leakage current increases as the temperature increases in the diode resistor combination 22 is employed. The I–V relationship on forward bias and backward bias is as follows:

$$I = I0(e^{v/m\phi T} - 1)$$

Thus, if temperature increases, leakage current increases.

The effect of the foregoing is shown in FIG. 3. FIG. 3 is a graph showing the frequency of an output signal across a temperature range of the circuit shown in FIG. 2. Frequency is measured at output terminal 8 by connecting a power supply and ground to the oscillator circuit. With reference to FIG. 3, data 30 and 32 were taken for the circuit biased in the forward direction 26, and in the backward direction 28. As can be seen, the frequency across the temperature change is relatively stable.

The foregoing embodiment has been given by way of example. The present invention is not limited to the exemplary embodiment, but is defined by the attached claims.

What is claimed is:

1. A temperature compensated oscillator circuit formed on a semiconductor substrate, comprising:

an inverter connected between an input terminal and an output terminal;

a feedback resistance connected in parallel with the inverter; and a temperature compensating means, having a leakage current connected in parallel with the feedback resistance.

2. The oscillator circuit of claim 1, wherein the inverter further comprises a plurality of series connected inverters.

3. A temperature compensated oscillator circuit formed on a semiconductor substrate, comprising:

an inverter connected between an input terminal and an output terminal;

a feedback resistance connected in parallel with the inverter; and a temperature compensating means connected in parallel with the feedback resistance, wherein the temperature compensating means further comprises a diode and resistor combination.

4. A temperature compensated oscillator circuit formed on a semiconductor substrate, comprising:

an inverter connected between an input terminal and an output terminal;

a feedback resistance connected in parallel with the inverter; and a temperature compensating means connected in parallel with the feedback resistance wherein the temperature compensating means further comprises a transistor having a grounded gate.

5. The oscillator circuit of claim 1, wherein the temperature compensating means is a diode.

* * * * *